(12) United States Patent
Lee et al.

(10) Patent No.: US 8,124,951 B2
(45) Date of Patent: Feb. 28, 2012

(54) PHASE CHANGE MEMORY DEVICE WITH ALTERNATING ADJACENT CONDUCTION CONTACTS AND FABRICATION METHOD THEREOF

(75) Inventors: Jang Uk Lee, Gyeonggi-do (KR); Kang Sik Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 158 days.

(21) Appl. No.: 12/641,535

(22) Filed: Dec. 18, 2009

(65) Prior Publication Data

US 2010/0301305 A1    Dec. 2, 2010

(30) Foreign Application Priority Data

Jun. 2, 2009   (KR) .................. 10-2009-0048357

(51) Int. Cl.
*H01L 47/00* (2006.01)
(52) U.S. Cl. ................... 257/2; 257/5; 257/E29.002
(58) Field of Classification Search ............. 257/2, 3, 257/4, 5, E29.002
See application file for complete search history.

(56) References Cited

U.S. PATENT DOCUMENTS

2010/0264393 A1 *  10/2010  Mikawa et al. ............. 257/2

FOREIGN PATENT DOCUMENTS

| JP | 3-967193 A | 6/2007 |
| KR | 1019960008572 B1 | 6/1996 |
| KR | 1020040081677 A | 9/2004 |

* cited by examiner

*Primary Examiner* — Hoai V Pham
(74) *Attorney, Agent, or Firm* — Ladas & Parry LLP

(57) ABSTRACT

A phase change memory device and an associated method of making same are presented. The phase change memory device, includes first wiring lines, second wiring lines, memory cells, and conduction contacts. The first wiring lines are arranged substantially in parallel to each other so that the first wiring lines are grouped into odd and even numbered first wiring lines. The memory cells are coupled to the first and second wiring lines. The conduction contacts coupled to the first wiring lines so that only one conduction contact is coupled to a center of a corresponding odd numbered first wiring line. Also only two corresponding conduction contacts are coupled to opposing edges of a corresponding even numbered first wiring line. Accordingly, the conduction contacts are arranged on the first wiring lines so that conduction contacts are not adjacent to each other with respect to immediately adjacent first wiring lines.

13 Claims, 5 Drawing Sheets

PHASE CHANGE MEMORY DEVICE WITH ALTERNATING ADJACENT CONDUCTION CONTACTS AND FABRICATION METHOD THEREOF

CROSS-REFERENCES TO RELATED APPLICATION

The present application claims priority under 35 U.S.C. 119(a) to Korean application number 10-2009-0048357, filed on Jun. 2, 2009, in the Korean Patent Office, which is incorporated by reference in its entirety as if set forth in full.

BACKGROUND

1. Technical Field

The embodiments described herein relate to a semiconductor memory device and, more particularly, to a phase-change memory device and a method for manufacturing the same.

2. Related Art

A phase change random access memory (PRAM) is regarded as a non-volatile memory device. PRAMs are manufactured using a phase-change material which is capable of reversibly changing phases between an ordered crystalline solid state phase and a disordered amorphous solid state phase as a function of temperature. PRAMs also provide a way of storing a set status or a reset status because their different solid state phases exhibit distinctly different resistance difference.

PRAM memory devices can be designed to be highly integrated. As a result, word line resistances in highly integrated PRAMs increase. Recently, metal contacts can be configured to be arranged between the cell strings and metal word lines so that they are connected to the metal contacts which minimizes this problem of an increased resistance of the word line.

FIG. 1 is a sectional view of a conventional PRAM. Referring to FIG. 1, diodes 107 are formed on a semiconductor substrate 101 which a junction region 103 as a word line is formed therein. Phase change material patterns 109 are formed on the diodes 107 to form respective unit memory cells. Top electrode contacts 113 and bit lines 117 are formed on the phase change material patterns 109. Herein, the reference numerals 105, 115 and 119 designate a first though a third interlayer insulating layers, respectively.

Word line contacts 121 are arranged to be coupled to the junction region 103 between adjacent cell strings 125 along every predetermined number of cell strings 125. A metal word line 123 which is electrically connected, i.e., coupled, to the word line contacts 121 are arranged vertically relative to the bit lines 117.

Typically, the word line contacts 121 are arranged every 8 unit memory cells. However, as the integration of a semiconductor memory device increases, the diameter of the word line contact 121 decreases. Accordingly, it is difficult to ensure the desired CD (Critical Dimension) in patterning holes for the word line contacts 121. Furthermore, since the space between the patterns becomes narrower, then a bridge with the adjacent holes can occur and thereby reduces the yield of the device.

FIG. 2 is a stylized lay out of the PRAM in FIG. 1. Referring to FIG. 2, the word line contacts 121 are shown arranged between every eight units of memory cells in the extension direction of the metal word line 123.

As the level of integration increases for semiconductor memory devices, it is becoming more difficult to ensure the desired CD. Also, as the distance D1 between the adjacent word line contacts 121 increases, unwanted bridges can occur between adjacent word line contacts 121. Furthermore, misalignment is also more likely to occur in forming the word line contacts 121. Furthermore, it becomes more and more difficult to ensure the minimum requirements to prevent misalignments as a result of downsizing the dimensional layout ratios of the device.

Furthermore, the process of forming contact holes with the two-layered through four-layered stack structures is carried out so as to form the word line contact 121. Since the photo and exposure process for the contact hole is carried out by using the high-cost apparatus, the cost required to form the word line contacts 121 in these types of stack structures which are arranged every 8 cell strings increases. Furthermore, when the diameter in the contact hole is reduced based on the demands for more highly integrated devices, then gap filling is more likely to be degraded which reduces the productivity of device.

SUMMARY

The inventive concept provides a phase change memory device and a method for manufacturing the same being capable of ensuring the margin between adjacent word line contacts.

The inventive concept also provides a phase change memory device and a method for manufacturing the same being capable of sufficiently ensuring adequately sized diameters of word line contacts irregardless of an increase in the downsizing ratio of the device.

According one embodiment provides a phase change memory device that includes a plurality of first wiring lines, a plurality of second wiring lines, a plurality of unit memory cells connected to the plurality of first wiring lines and the plurality of second wiring lines, and a plurality of conduction contacts configured to be connected to the first wiring lines every desired unit memory cell number, wherein the conduction contacts of the plurality of conduction contacts which are arranged on adjacent first wiring lines are configured not to be arranged adjacent to each other in a second wiring line direction.

Another example embodiment provides a phase change memory device includes a plurality of junction type word lines configured to be arranged to be spaced apart in parallel, a plurality of metal word lines configured to be arranged over the plurality of junction type word lines, and a plurality of conduction contacts configured to electrically connect the plurality of junction type word lines with the plurality of metal word lines and to be arranged along every desired cell string number, wherein each of conduction contacts of the plurality of conduction contacts arranged in each of odd word lines of the plurality of junction type word lines is arranged between conduction contacts of the plurality of conduction contacts arranged in each of even word lines of the plurality of junction type conduction contacts which is adjacent to each of the odd word lines.

Still another example embodiment provides a method for manufacturing a phase change memory device that includes forming a plurality of unit phase change memory cells on a semiconductor substrate which junction regions are formed therein, forming a plurality of conduction contacts configured to be connected to the junction regions every a desired unit phase change memory cell number, and forming a plurality of first wiring lines configured to be connected to the plurality of conduction contacts, wherein conduction contacts of the plurality of conduction contacts which are arranged on adjacent first wiring lines are configured not to be arranged adjacent to each other in a second wiring line direction.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
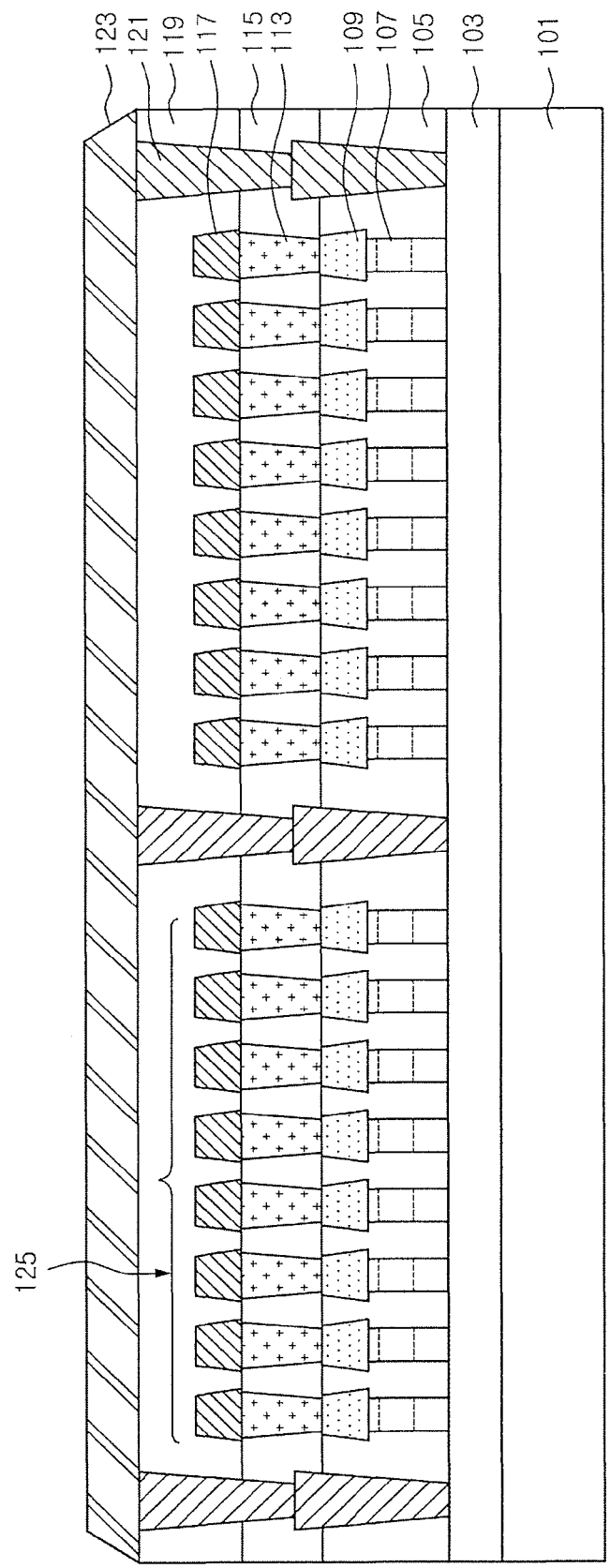
FIG. 1 is a sectional view of a conventional phase change memory device.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements.

Figure 3:
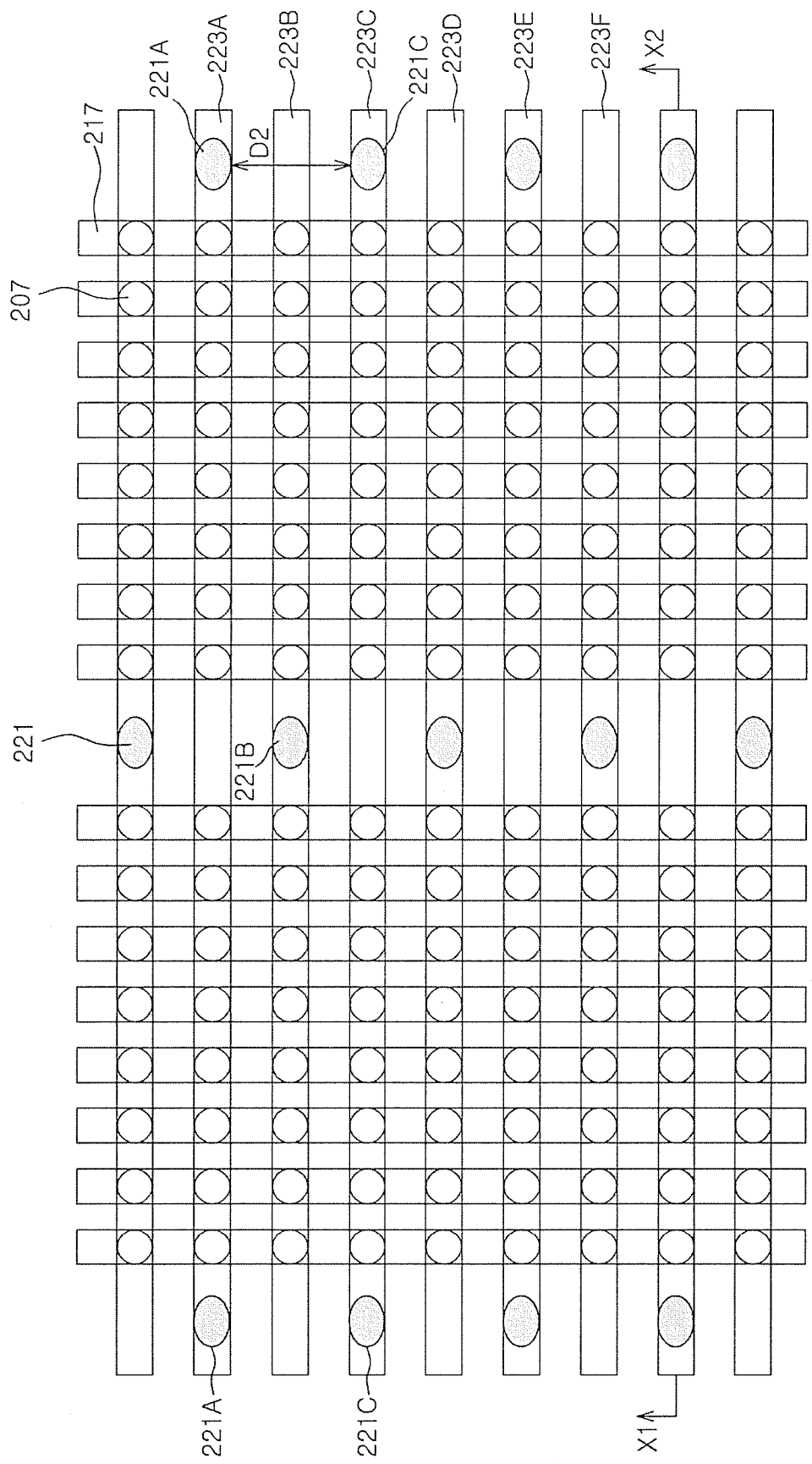
FIG. 3 is a lay out of a phase change memory device according to an example embodiment.

FIG. 3 is a lay out of a phase change memory device according to an example embodiment. Referring to FIG. 3, a plurality of conduction contacts 221 are arranged between every desired number of unit memory cells in a first wiring line direction. In a second wiring line direction, each of the conductive contacts 221 is configured not to be arranged adjacent to the conduction contact 221 which is connected to adjacent first wiring line. The conduction contacts 221 are arranged in adjacent first wiring lines are configured not to be arranged adjacent to each other in the second wiring line direction.

Herein, the first wiring lines may be word lines or metal word lines 223 and second wiring lines may be bit lines 217. The first and second wiring lines are orthogonally crossed to each other. The conduction contacts 221 serve as word line contacts.

For example, as shown in FIG. 3, the word line contacts 221 are arranged along every sixteen units of memory cells. Word line contacts 221A arranged in the first metal word lines 223A are not arranged adjacent to the word line contacts 221B arranged in the second metal word lines 223B which are arranged adjacent to the first metal word lines 223A in the direction of the bit line 217. Similarly, word line contacts 221B of the word line contacts 221 arranged in the second metal word lines 223B are not arranged adjacent to the word line contacts 221C arranged in the third metal word lines 223C which are arranged adjacent to the second metal word lines 223B in the direction of the bit line 217.

Figure 2:
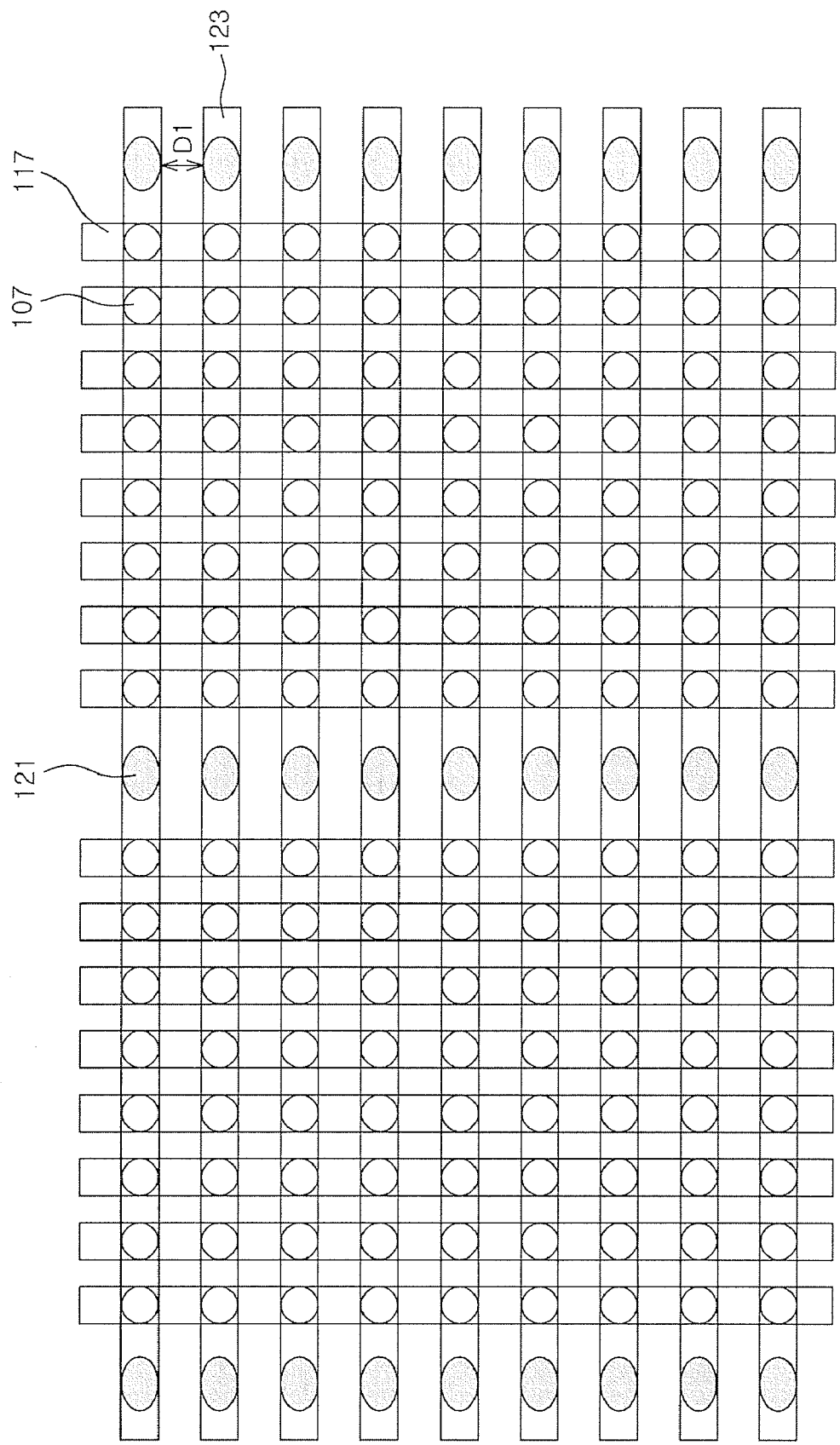
FIG. 2 is a lay out of the conventional phase change memory device in FIG. 1.

Accordingly, a minimum distance D2 between the word line contacts adjacent in the direction of the bit line 170 is ensured by at least the width of the metal word line 223 plus the distance D1 of FIG. 2 between the word line contacts in the prior device.

Figure 4:
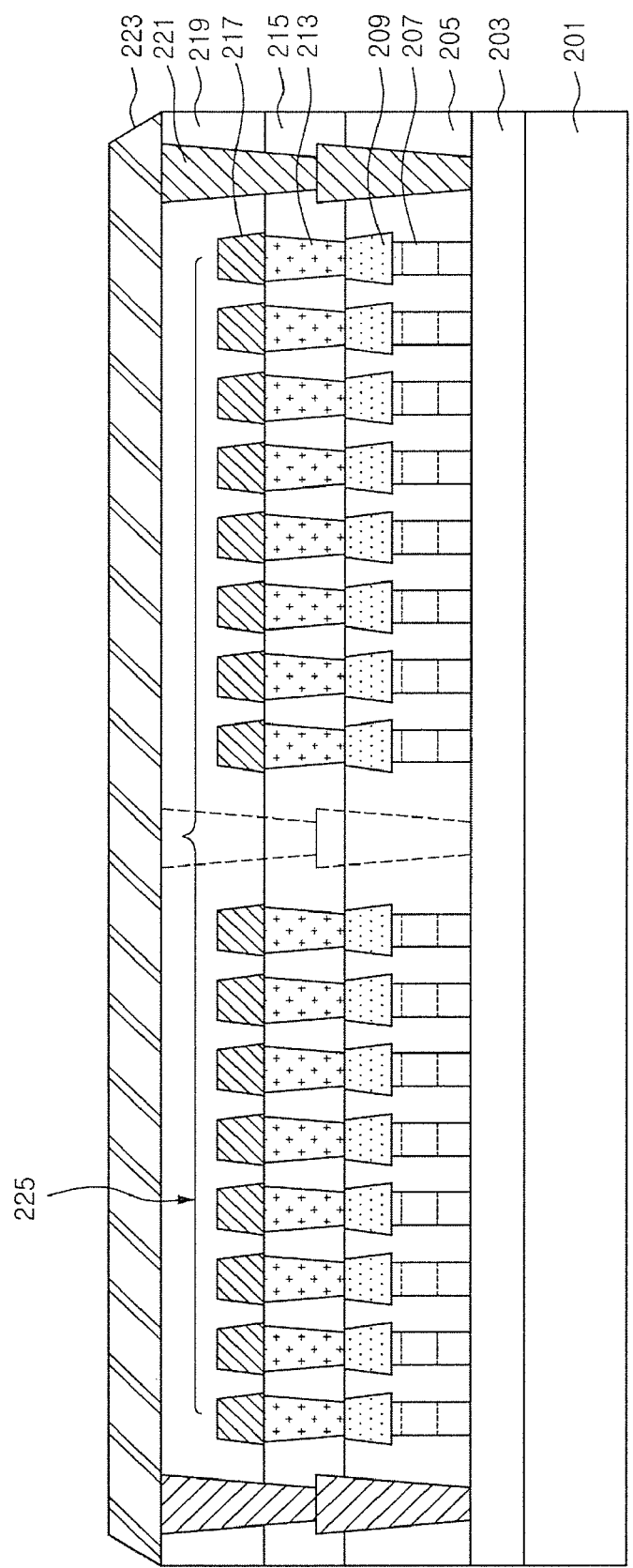
FIG. 4 is a sectional view of the phase change memory device in FIG. 3.

FIG. 4 is a sectional view of the phase change memory device taken along the line X1-X2 of FIG. 3. Referring to FIG. 4, a junction region 203 serving as a word line is formed in a semiconductor substrate 203. Diodes 207 and phase change material patterns 209 are formed on the junction region 203 to form unit memory cells. Then, top electrode contacts 213 and the bit lines 217 being electrically connected the top electrode contacts 213 are formed on the phase change material patterns 209.

Word line contacts 221 on the immediately adjacent metal word lines of the metal word lines 223 are configured not to be arranged adjacent to each other along the bit line direction. Accordingly, in the example embodiment, the number of word line contacts are reduced, while the number of cell strings 225 between the word line contacts 221 can be increased.

The reference numeral 205, 215 and 219 designate a first through third interlayer insulating layers. Metal word lines 223 are arranged to be electrically connected, i.e., coupled, to the word line contacts 221.

For example, in the phase change memory device of the prior art as depicted in FIG. 1, the word line contacts are arranged along every eight unit memory cells. However, in the example embodiment, as depicted in FIGS. 3 and 4, the word line contacts are arranged along every sixteen unit memory cells such that the word line contacts which are arranged on the adjacent metal word lines are configured not to be arranged adjacent to each other.

As compared with FIG. 1 and FIG. 4, it is known that a number of word line contacts are reduced. Depending on reducing the number of word line contacts, the number of cell strings which can be formed between the word line contacts can be increased, thereby improving the integrity of the memory device.

In the example embodiment, the minimal distance separating adjacent word line contacts in the bit line direction can be sufficiently ensured such that the bridge between the word line contacts can be protected against. Furthermore, the diameter of the word line contact can be ensured at the maximum irregardless of an increase in the shrinkage of the device and gap filling in the word line contact hole can be improved.

The high-cost photo and exposure apparatus is required in the process of forming fine contact holes. However, in the example embodiment, since the diameter of the word line contact hole can be ensured at a maximum, a low-cost apparatus can be used instead of using a high-cost photo and exposure apparatus. Furthermore, the number of word line contact holes can be reduced such that the cost required in forming the word line contact hole can be considerably reduced.

In FIGS. 3 and 4, for example, the word line contacts are shown arranged every sixteen unit memory cells. However, it is understood herein that it is not limited thereto and a number of unit memory cells which be formed between the word line contacts in the phase change memory device can be modified to the design purpose of the phase change memory device.

Figure 5:
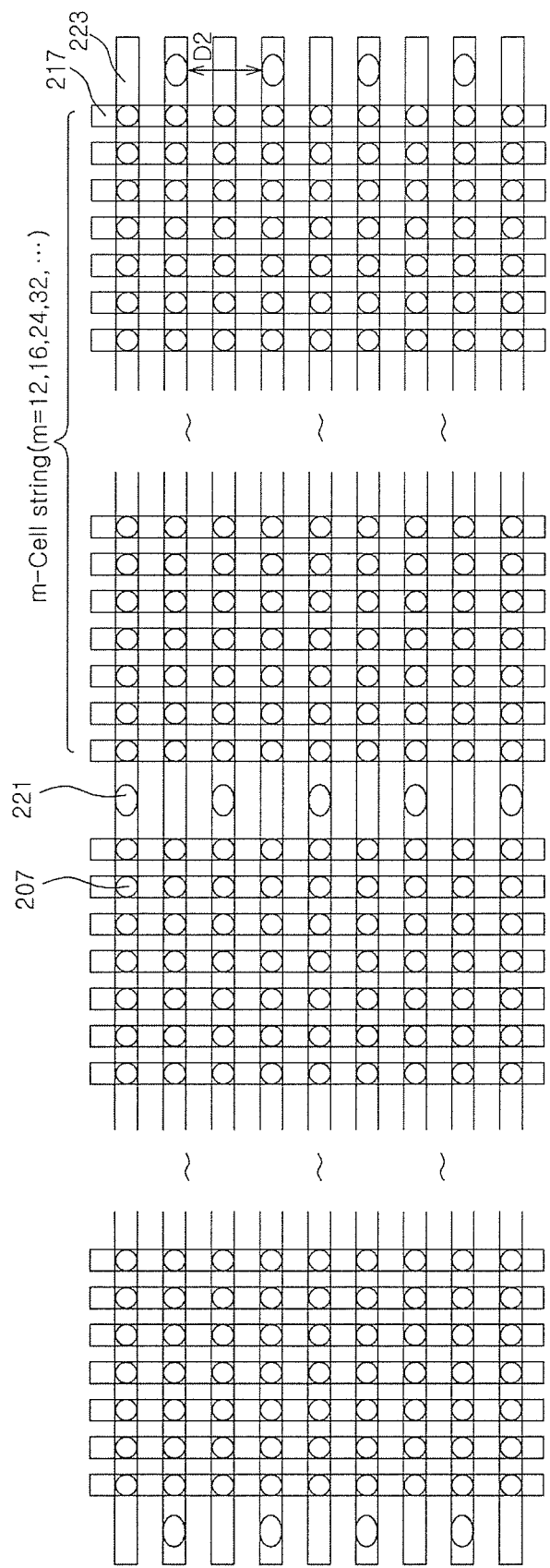
FIG. 5 is a lay out of a phase change memory device according to another example embodiment.

FIG. 5 is a lay out of a phase change memory device according to another example embodiment. Referring to FIG. 5, m cell strings are arranged between two word line contacts 221 in the direction of a metal word line 223 or the word line direction. It is understood herein that m may be any number in which m is preferably designated as twelve, sixteen, twenty four, thirty two, or more.

Accordingly, one embodiment of the phase change memory device can include first wiring lines (e.g., word lines 223) arranged substantially in parallel to each other such that the first wiring lines (e.g., word lines 223) are grouped into odd numbered first wiring lines (e.g., 223A, 223C, and 223E) and grouped into even numbered first wiring lines (e.g., 223B, 223D, and 223F). The phase change memory device can have second wiring lines (e.g., bit lines 217). The phase change memory device can have memory cells (e.g., diodes 207 coupled to phase change material patterns 209) such that the memory cells are coupled together the first and second wiring lines (e.g., 223, 217). The phase change memory device can also have conduction contacts (e.g., word line contacts 221) coupled to the first wiring lines (e.g., word lines 223). Only one conduction contact (e.g., word line contacts 221) is coupled to a center of a corresponding odd numbered first wiring line (e.g., any one of 223A, 223C, and 223E). Only two corresponding conduction contacts (e.g., word line contacts 221) are coupled to opposing edges of a corresponding even numbered row first wiring line (e.g., any one of 223B, 223D, and 223F). The conduction contacts (e.g., word line contacts 221) are arranged on the first wiring lines (e.g., word lines 223) so that conduction contacts (e.g., word line contacts 221) are not adjacent to each other with respect to immediately adjacent first wiring lines (e.g., word lines 223). The more cell strings between two adjacent word line contacts increase, the more highly integrated the memory device can be.

According to a phase change memory device and a manufacturing method thereof, the distance between adjacent word line contacts can be sufficiently ensured such that the bridge between word line contacts can be prevented and the contact misalignment margin can be ensured. Furthermore, irregardless of an increase in the downsizing ratio of device, the diameter of the word line contact hole can be sufficiently ensured as well as the process step for forming the word line contact hole can be reduced such that the low-cost photo and exposure apparatus can be used in forming the word line contact hole and the production cost can be reduced.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A phase change memory device, comprising:
    a plurality of first wiring lines arranged substantially in parallel to each other such that the first wiring lines are grouped into odd and even numbered first wiring lines;
    a plurality of second wiring lines;
    a plurality of memory cells coupled to the first and second wiring lines; and
    a plurality of conduction contacts coupled to the first wiring lines,
    wherein only one conduction contact is coupled to a center of a corresponding odd numbered first wiring line,
    wherein only two corresponding conduction contacts are coupled to opposing edges of a corresponding even numbered first wiring line,
    wherein the conduction contacts are arranged on the first wiring lines so that conduction contacts are not adjacent to each other with respect to immediately adjacent first wiring lines.

2. The phase change memory device of claim 1, wherein the first wiring lines are arranged substantially orthogonally with respect to the second wiring lines.

3. The phase change memory device of claim 1, wherein the first wiring lines are word lines.

4. The phase change memory device of claim 3, the second wiring lines are bit lines.

5. The phase change memory device of claim 1, wherein each memory cell comprises a phase change material pattern coupled to a diode.

6. The phase change memory device of claim 1, wherein the memory cells are grouped into cell strings.

7. The phase change memory device of claim 6, wherein each cell string has m number of memory cells.

8. The phase change memory device of claim 6, wherein the one conduction contact coupled to the center of the corresponding odd numbered first wiring line is positioned between a pair of cell strings.

9. The phase change memory device of claim 6, wherein two cell strings along the corresponding even numbered first wiring line are between the two corresponding conduction contacts.

10. The phase change memory device of claim 1 further comprising a plurality of third wiring lines arranged in parallel to each other and positioned underneath the first wiring lines.

11. The phase change memory device of claim 10 wherein the third wiring lines are junction word type word lines.

12. The phase change memory device of claim 3 wherein the first wiring lines are metal word lines.

13. The phase change memory device of claim 1 wherein the second wiring lines are coupled to the memory cells.

* * * * *